United States Patent [19]

Vo et al.

[11] Patent Number: 5,424,226
[45] Date of Patent: Jun. 13, 1995

[54] METHOD OF FABRICATING NMOS AND PMOS FET'S IN A CMOS PROCESS

[75] Inventors: Tuan A. Vo, Hawthorne; Mohamad M. Mojaradi, Los Angeles; Guillermo Lao, Hawthorne, all of Calif.

[73] Assignee: Xerox Corporation, Stamford, Conn.

[21] Appl. No.: 225,673

[22] Filed: Apr. 11, 1994

[51] Int. Cl.⁶ ............... H01L 21/266; H01L 21/336; H01L 21/8238; H01L 21/8236
[52] U.S. Cl. ......................... 437/30; 437/57; 437/149; 257/404; 257/369
[58] Field of Search ............ 437/40, 41, 57, 59, 437/34, 149, 30; 257/369, 403, 404

[56] References Cited

U.S. PATENT DOCUMENTS

| | | | |
|---|---|---|---|
| 4,818,719 | 4/1989 | Yeh et al. | 437/57 |
| 4,841,346 | 6/1989 | Noguchi | 437/29 |
| 4,968,637 | 11/1990 | Mozzi et al. | 437/40 |
| 4,975,385 | 12/1990 | Beinglass et al. | 437/44 |
| 5,024,959 | 6/1991 | Pfiester | 437/34 |
| 5,030,581 | 7/1991 | Yakushiji et al. | 437/27 |
| 5,071,777 | 12/1991 | Gahle | 437/29 |
| 5,162,679 | 10/1992 | Shen et al. | 307/530 |
| 5,296,401 | 3/1994 | Mitsui et al. | 437/57 |
| 5,328,859 | 7/1994 | Vo et al. | 437/31 |
| 5,369,295 | 11/1994 | Vinal | 257/288 |

OTHER PUBLICATIONS

Wolf, "Silicon Processing for the VLSI Era," vol. II, pp. 354–356, 1990.

Primary Examiner—Olik Chaudhuri
Assistant Examiner—Richard A. Booth
Attorney, Agent, or Firm—Robert Cunha

[57] ABSTRACT

A FET which can be formed on a silicon substrate and which can operate in the enhancement mode. The n+ source and drain are centrally located within n-wells which extend under the gate area, and are separated by a distance. By appropriately choosing the distance between n-wells, different threshold voltages can be obtained for several transistors on the same chip.

2 Claims, 8 Drawing Sheets

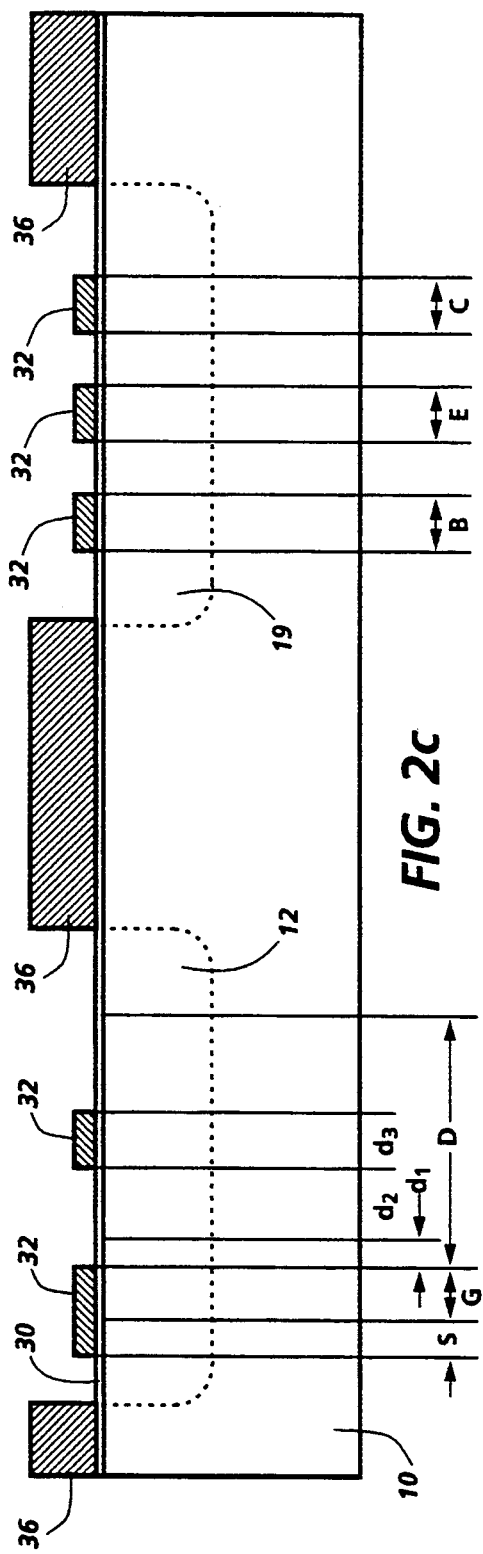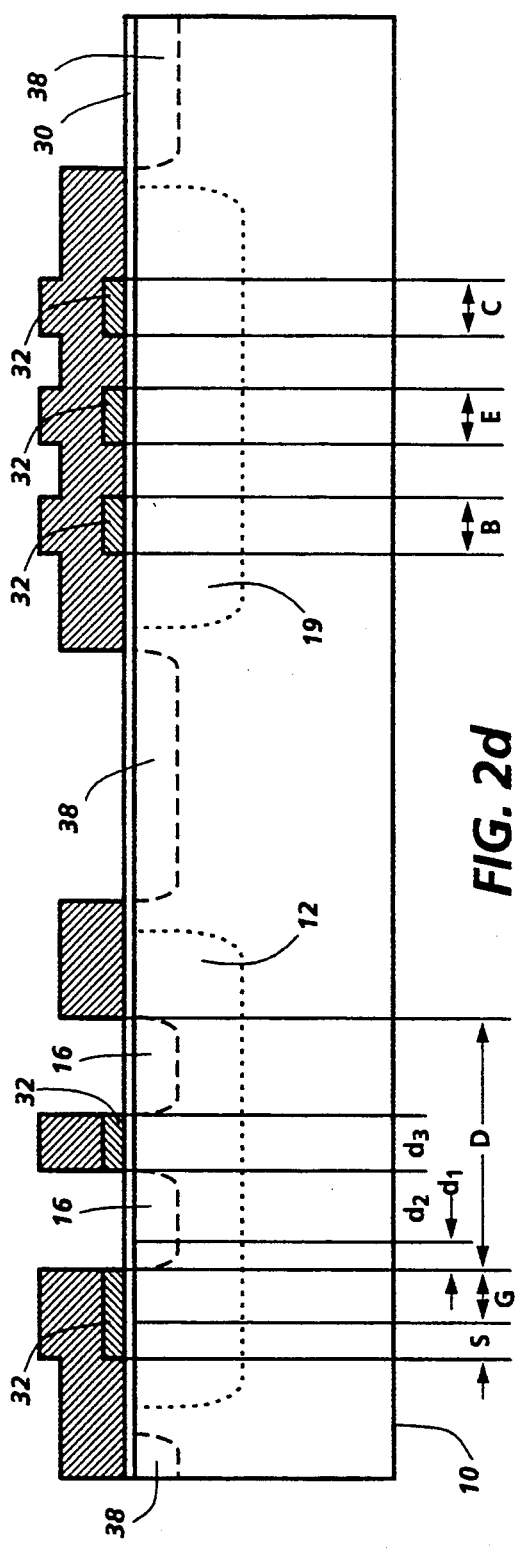

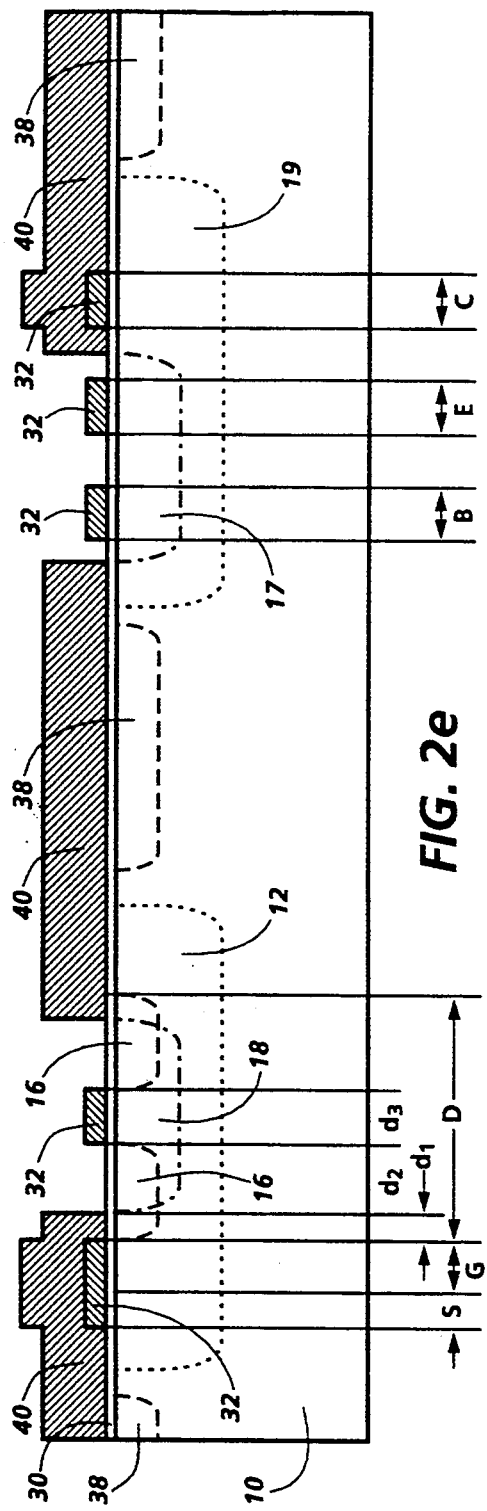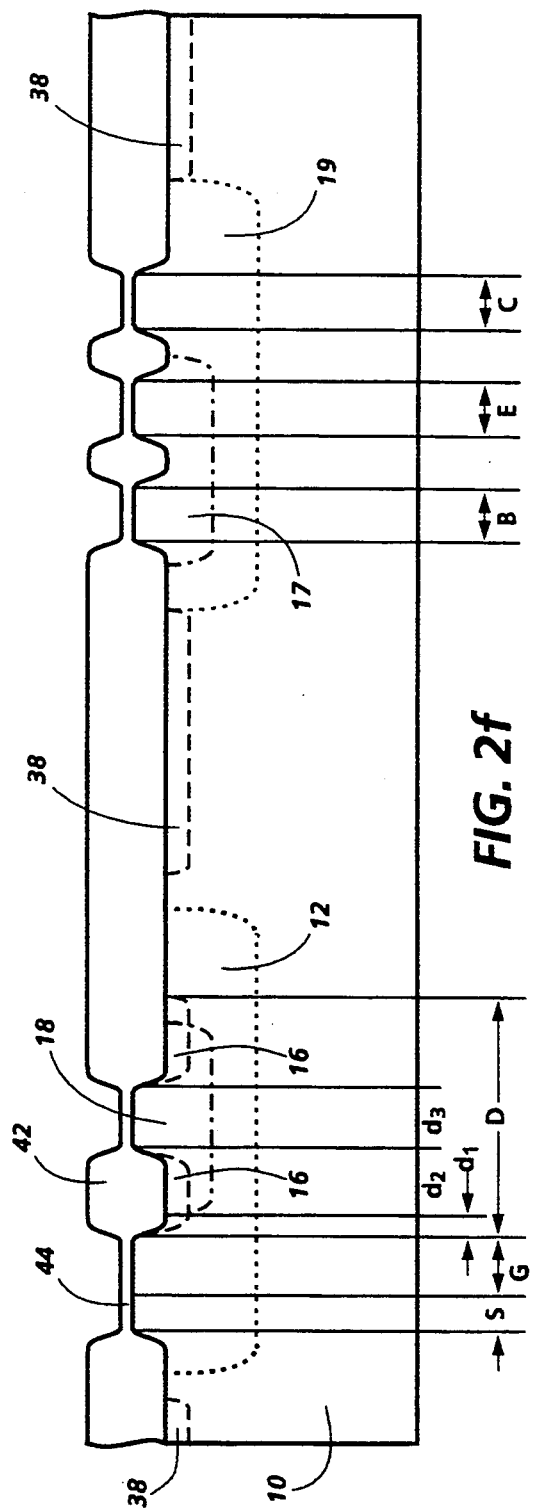

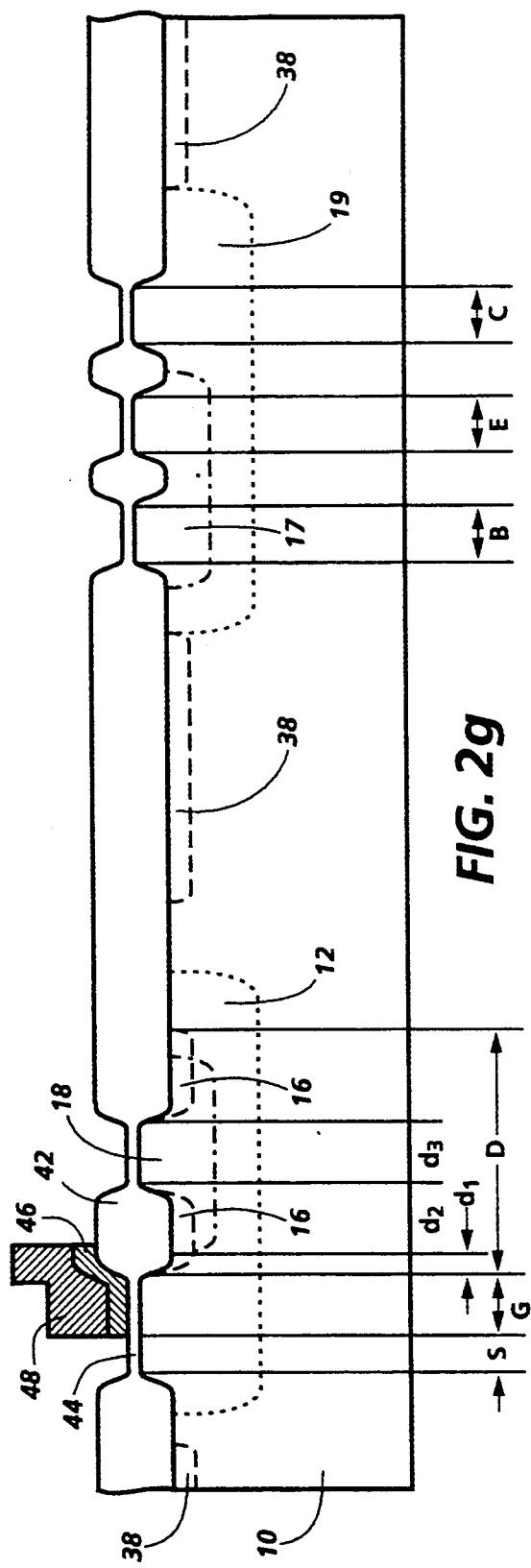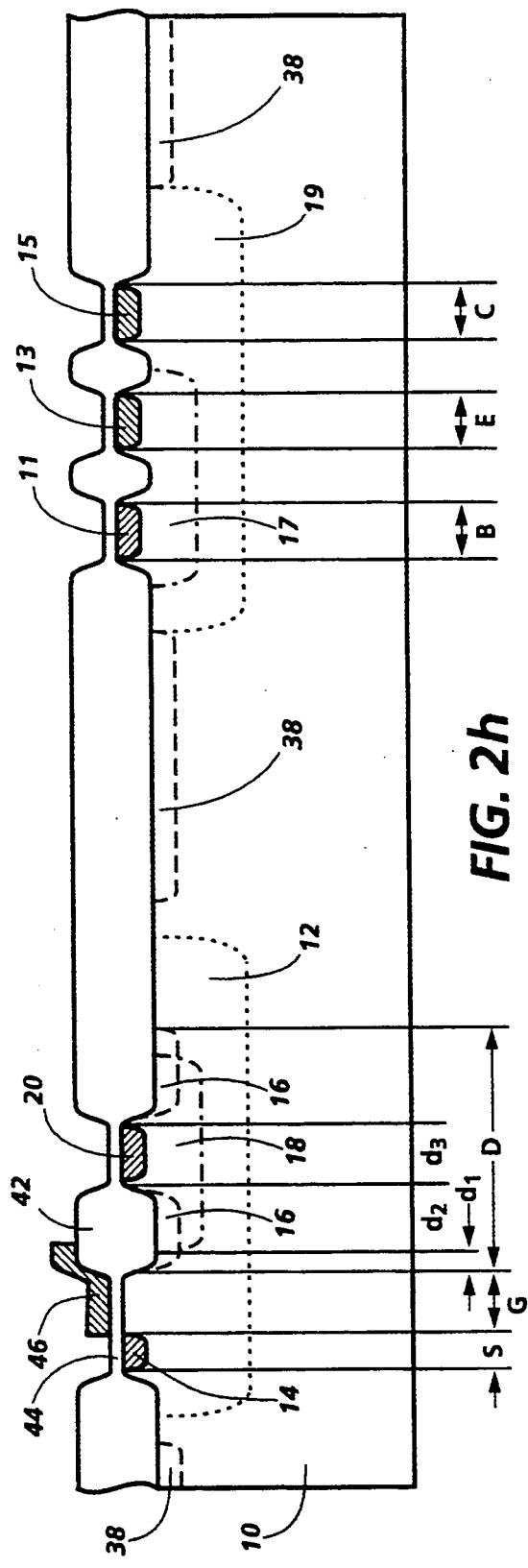

METHOD OF FABRICATING NMOS AND PMOS FET'S IN A CMOS PROCESS

BACKGROUND OF THE INVENTION

The process of fabricating a depletion mode NMOS transistor during the standard process of fabricating a CMOS device by extending the source and drain regions of the transistor into the gate area.

A depletion mode NMOS transistor is a useful device in some applications such as an input noise reduction circuit or an input gate protection device. However, to build one such a device on a CMOS device using the regular CMOS process would normally require changes in the mask layers and process sequence. The capability of building NMOS depletion mode transistors in an otherwise standard CMOS circuit using the standard CMOS process would be a significant advantage.

SUMMARY OF THE INVENTION

Such a transistor can be built by extending the source and drain regions into the gate area by two separate n-wells. The key parameter in this device is the separation distance between the n-wells under the gate area. The lateral diffusion of the n-well plus the depletion region when a voltage is applied across the source and drain will form a conduction channel under the gate. By appropriately choosing the distance between the n-wells, one can obtain several depletion mode devices with different threshold voltages on the same chip. At the same time these devices can withstand high voltage because of the extension of the n+ drain region by the n-well.

This discussion assumes an n-channel transistor on a p-substrate, but this invention is equally applicable to a p-channel transistor comprising p-wells on an n-substrate.

BRIEF DESCRIPTION OF THE DRAWINGS

FIGS. 2a through 2j are a detailed description of the BiMOS process steps.

DETAILED DESCRIPTION OF THE INVENTION

Figure 1A:
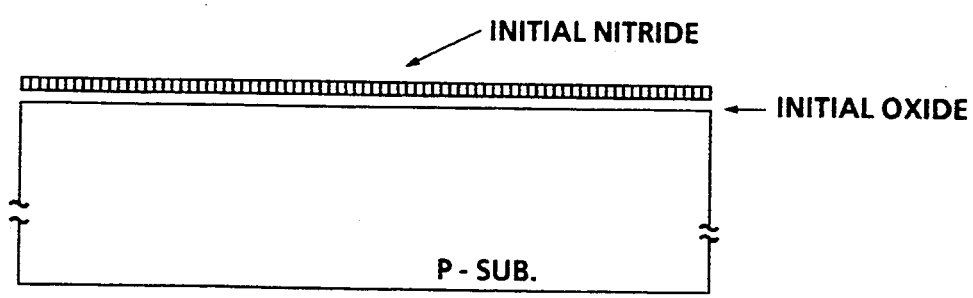
FIGS. 1a through 1h are a simplified set of drawings illustrating the fabrication steps required to produce this depletion mode NMOS transistor.
Figure 1B:
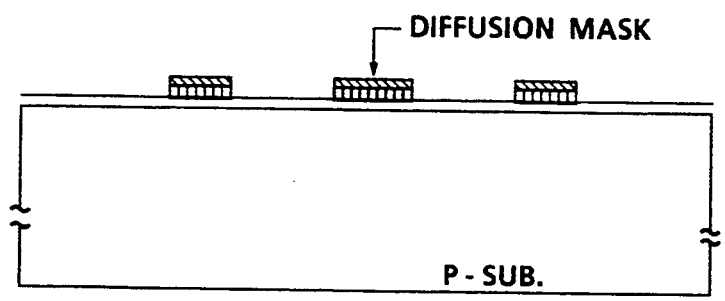
Figure 1C:
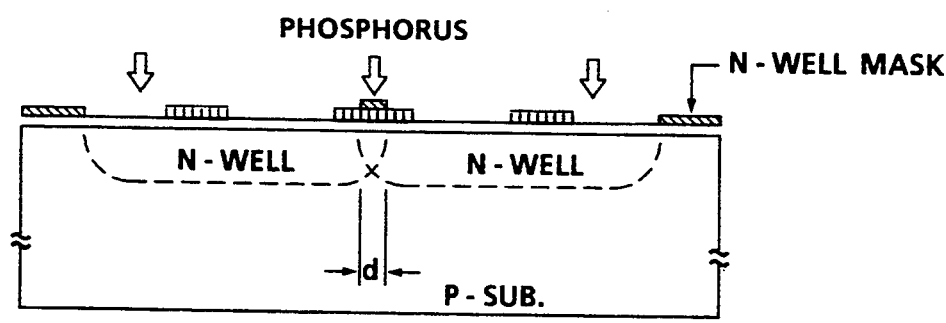
Figure 1D:
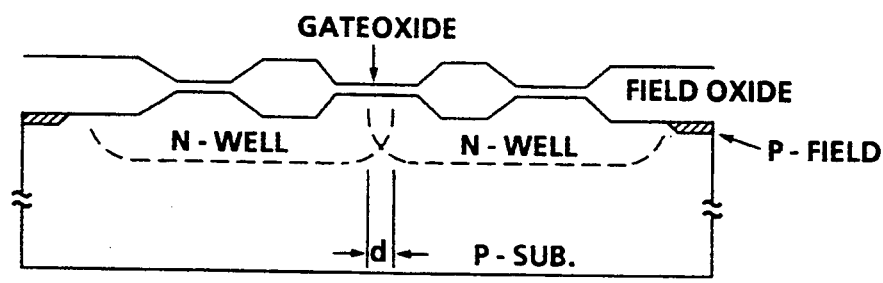
Figure 1E:
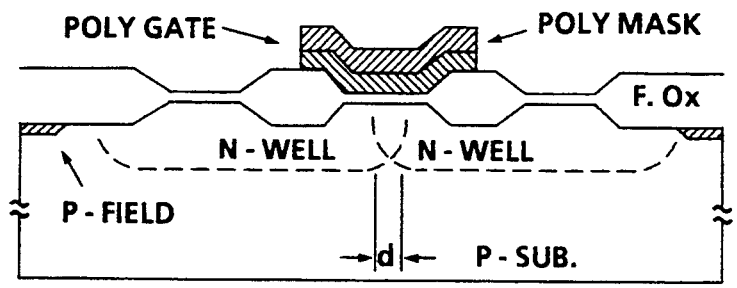
Figure 1F:
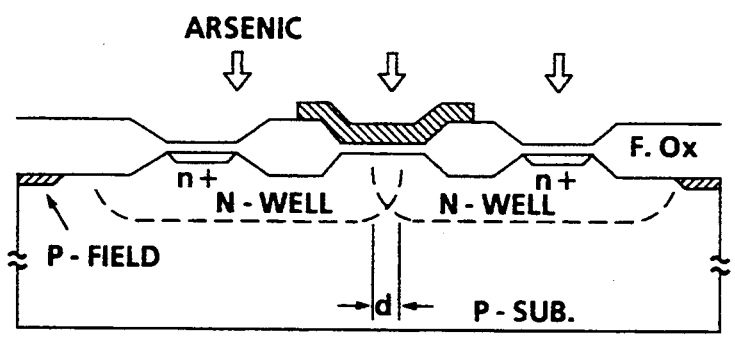
Figure 1G:
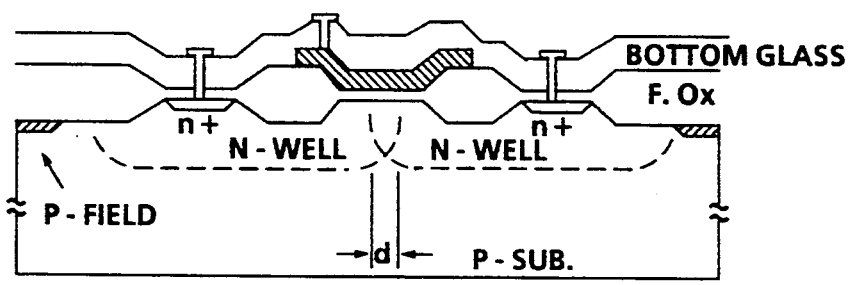
Figure 1H:
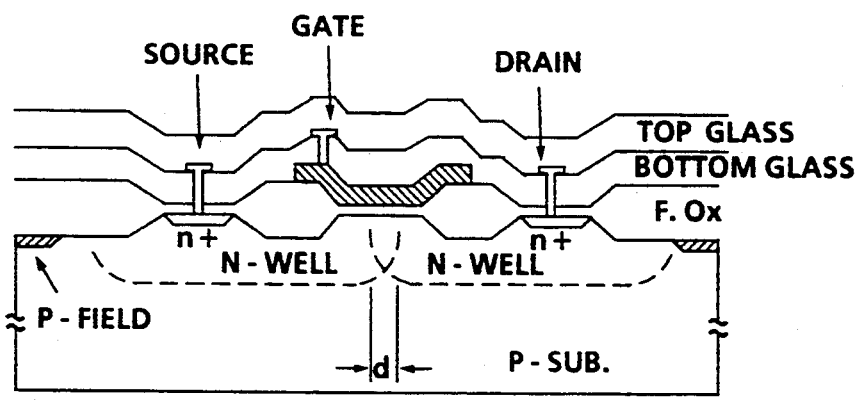

FIG. 1h is a cross section of the finished device showing the source as an n+ area in one n-well, and a drain as an n+ area in a second n-well, the n-wells separated by a distance d. This distance d is a variable which can be controlled to form transistors having various properties. If there is a clear distance between the n-wells under the gate, the transistor will operate in the enhancement mode, while if the n-wells overlap, the transisitor will operate in the depletion mode. Further, the greater degree of overlap, the greater the threshold voltage. For example, threshold voltages of from minus 1 to minus 10 volts are possible, as the amount of overlap increases.

The fabrication of this transistor on a p-type substrate is shown in FIGS. 1a through FIG. 1h. The process starts in FIG. 1a with uniform oxide and nitride layers on the p-substrate. FIG. 1b shows the result of the diffusion mask and nitride etch steps. FIG. 1c shows the n-well mask and the phosphorous n-well implant to create two n-wells separated by the distance d. The distance d may be negative, in which case the wells overlap. These process steps will be discussed in detail below.

After the field oxide mask, field implant, nitride etch, field oxidation and gate oxidation steps, the structure is as shown in FIG. 1d. FIG. 1e shows the result of the poly depostion, mask and etch which forms the gate. In FIG. 1f, the gate and drain are formed by a n+ source/drain mask and implant of arsenic. Then, as shown in FIG. 1g the bottom glass passivation layer, contact mask, contact etch, metal deposition, metal mask and metal etch apply contacts to the source, gate and drain. Finally, the top glass is applied to form the finished transistor as shown in FIG. 1h.

The above is a description of a BiMOS process. The following description is included for an understanding of the simultaneous fabrication of both this NMOS transistor and the remainder of the CMOS devices. A description of this BiMOS process, modified to also produce a high voltage npn transistor and a high voltage annular PMOS device with a triple diffused conductive drift region, is contained in "Bipolar Transitors with High Voltage MOS Transistors in a Single Substrate", U.S. Pat. No. 5,229,308, which is incorporated herein by reference. Referring now to FIGS. 2a through 2j, a sequence of process steps used to manufacture a MOS transistor 6 and a bipolar transistor 8 according to the present invention is shown. Thicknesses of the layers shown are not necessarily proportional.

Figure 2A:
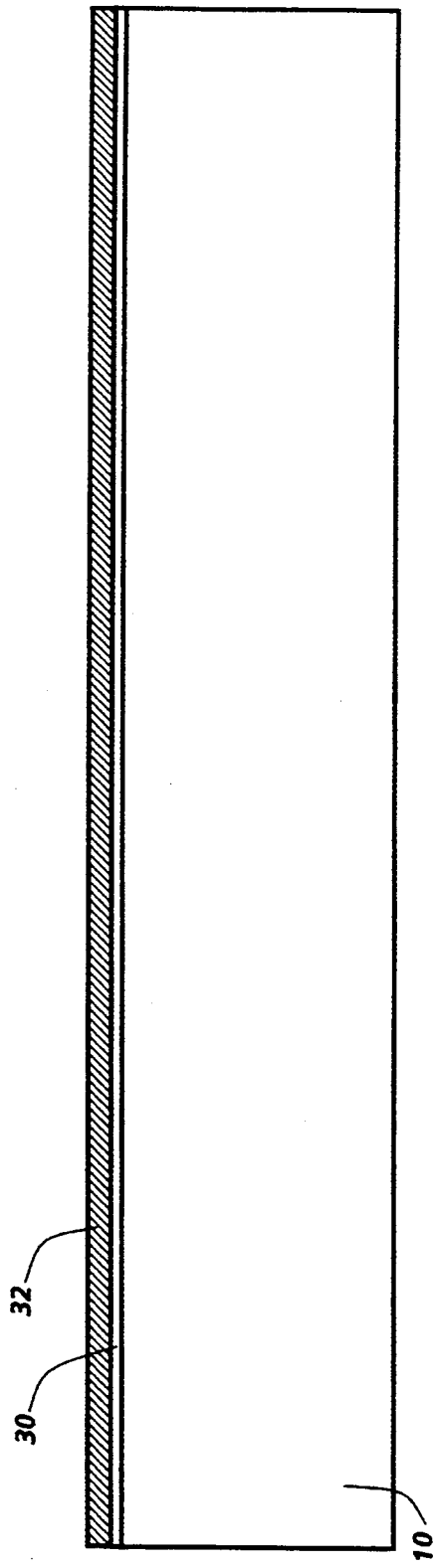

In FIG. 2a there is shown the p-type silicon substrate 10 with an initial oxide layer 30 grown on substrate 10 and an initial nitride layer 32 deposited on the silicon oxide layer 30. The oxide layer is grown using conventional methods and may be from 200Å to 500Å thick. The nitride layer is deposited using conventional methods and may be from 800Å to 1200Å thick.

Figure 2B:
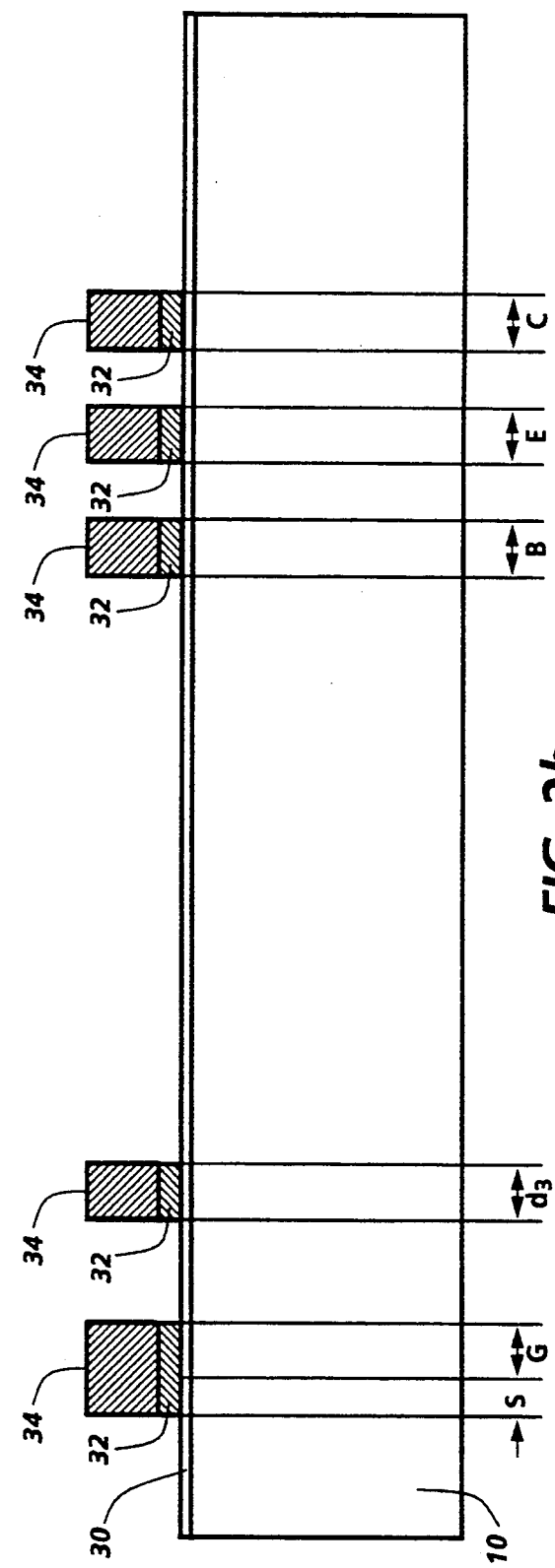

In FIG. 2b, using conventional patterning techniques, a photoresist layer 34 with a thickness of from 1.0 $\mu$m to 2.0 $\mu$m is formed. The nitride layer 32 shown in FIG. 2a is then etched to provide the nitride structure 32 shown in FIG. 2b. This remaining nitride layer 32 defines the regions that will eventually become the diffusion areas of the MOS transistor 6 and the bipolar transistor 8. The source contact region 14, drain contact region 20, base contact region 11, emitter region 13, and the collector region 15 have all been designated and will be formed underneath the remaining nitride layer 32 in subsequent steps.

Subsequently, as shown in FIG. 2c, n-wells 12, 19 are formed by use of the n-well mask forming a new photoresist pattern 36 and a subsequent n-well implant, these steps being performed in the conventional manner. A conventional high energy implant process utilizing a dosage from $1 \times 10^{12}$ atoms per square centimeter to $5 \times 10^{12}$ atoms per square centimeter with an energy level from 200 Kev to 300 Kev is used to penetrate the nitride/oxide pattern. Since the photoresist 36 is approximately ten times thicker than either nitride or oxide, the implant will not penetrate through the photoresist pattern but will penetrate the oxide 30 and nitride 32 not covered by the photoresist 36. The photoresist layer 36 is deposited according to conventional techniques.

In the next process step shown in FIG. 2d, boron field implant regions are made using the same conventional masking process steps and implantation process steps used in forming the n-well region 12. The boron field implants are implanted at a concentration of $5 \times 10^{12}$ atoms per square centimeter to $9 \times 10^{12}$ atoms per square centimeter and an energy of 20 Kev to 30 Kev. After drive-in, the concentration of boron will be between approximately $1 \times 10^{17}$ atoms per cubic centimeter to $5 \times 10^{17}$ atoms per cubic centimeter. The field implants will provide both the channel stop regions 38 and the first drift region contact 16 within the drain region "D" of the transistor. Since the implant is performed with a low energy, the nitride layer will block the field implant.

Using a photo resist pattern 40 and the conventional implanting techniques of the previous steps, a p-well implant region is made as is shown in FIG. 2e. The implant dosage is in the range of $5 \times 10^{12}$ atoms per square centimeter to $9 \times 10^{12}$ atoms per square centimeter and the implant energy is from 85 Kev to 110 Kev. After drive-in, the concentration of boron will be between approximately $3.5 \times 10^{17}$ atoms per cubic centimeter to $6.5 \times 10^{17}$ atoms per cubic centimeter. This process step will simultaneously make both the second drift region implant 18 of the high voltage MOS transistor and the base region 17 of the bipolar transistor 8. This enables the production of the MOS transistor 6 with bipolar transistors 8 without using the extra masks and implant steps that would be needed in a traditional process. These steps can be combined for any processes that seek to make both bipolar and MOS transistors on a single substrate. Since the implant is performed with a high energy, the nitride layer will not block the implant.

The completion of the transistor is shown in FIGS. 2f through 2j and follows well known and conventional process techniques.

In FIG. 2f, the remaining nitride layer 32 is etched away, and field oxides 42 and gate oxides 44 are grown. The field oxides are from 1000Å to 9000Å thick and the gates oxides are from 200Å to 400Å thick. Notice also, that some lateral diffusion of the channel stop region 38 occurs resulting in contact between the channel stop region 38 and n-well region 19.

Subsequently, the polysilicon gate 46 of the transistor is shown after formation in FIG. 2g. The steps of polysilicon deposition, definition of polysilicon areas with a new mask and photoresist pattern 48, and then poly etch of all areas not protected by photoresist 48 are performed. The polysilicon gate 46 has a thickness of from 3000Å to 5000Å.

Once again, the mask and photoresist pattern is changed to define the N+ implant areas that will become the emitter area 13 and the collector area 15 (see FIG. 2h) for the bipolar transistor and those areas are implanted with phosphorus at an implant level of $5 \times 10^{15}$ atoms per square centimeter to $5 \times 10^{16}$ atoms per square centimeter at an energy level of from 70 Kev to 80 Kev. Then the mask and photoresist pattern is changed to define the source contact 14 and drain contact 20 areas of high voltage transistor and the base area 11 of the npn bipolar transistor, and these areas are implanted with boron. The boron implantation is at a dosage of $1 \times 10^{15}$ atoms per square centimeter to $5 \times 10^{15}$ atoms per square centimeter and an energy level of from 55 Kev to 75 Kev. This implant step will create the p+-type source implant region 14 as well as the final p+ area in the drain contact region 20 and the base region 11 of the npn bipolar transistor as is shown in FIG. 2h.

The transistor has three concentration regions, "d1", "d2", "d3" within the drain region "D". Region "d1" is the first drift region and is the area where only the first drift region implant 16 has been implanted. The concentration of this region "d2" is between approximately $1 \times 10^{17}$ atoms per cubic centimeter to $5 \times 10^{17}$ atoms per cubic centimeter. Region "d2" is the second drift region and is located where the first drift region implant 16 and the second drift region implant 18 overlap. Because the concentrations are additive the resultant concentration is between approximately $4.5 \times 10^{17}$ atoms per cubic centimeter to $11.5 \times 10^{17}$ atoms per cubic centimeter. Region "d3" is the just finished drain contact region 20.

It is the now finished triple diffused "d1", "d2", "d3" drain region "D" that gives the transistor its special high voltage characteristics. Depending upon scalable device dimensions, this transistor operates within a voltage range of 50 volts to 200 volts, well above the normal operating range of conventional transistors of 5 volts. This drain region "D" is composed of three separate increasing implant concentration regions, first and second drift regions "d1", "d2", and the drain contact region "d3" that were made in the steps shown in FIGS. 2d, 2e, and 2h. In contrast to the conventional processes for making a transistor, the processing of the triple diffused drain transistor of the above described invention is effected by combining step sequences with other structures to be present on the semiconductor device, so that a transistor of increased complexity can be built without increasing the complexity of the processing sequence.

Figure 2I:
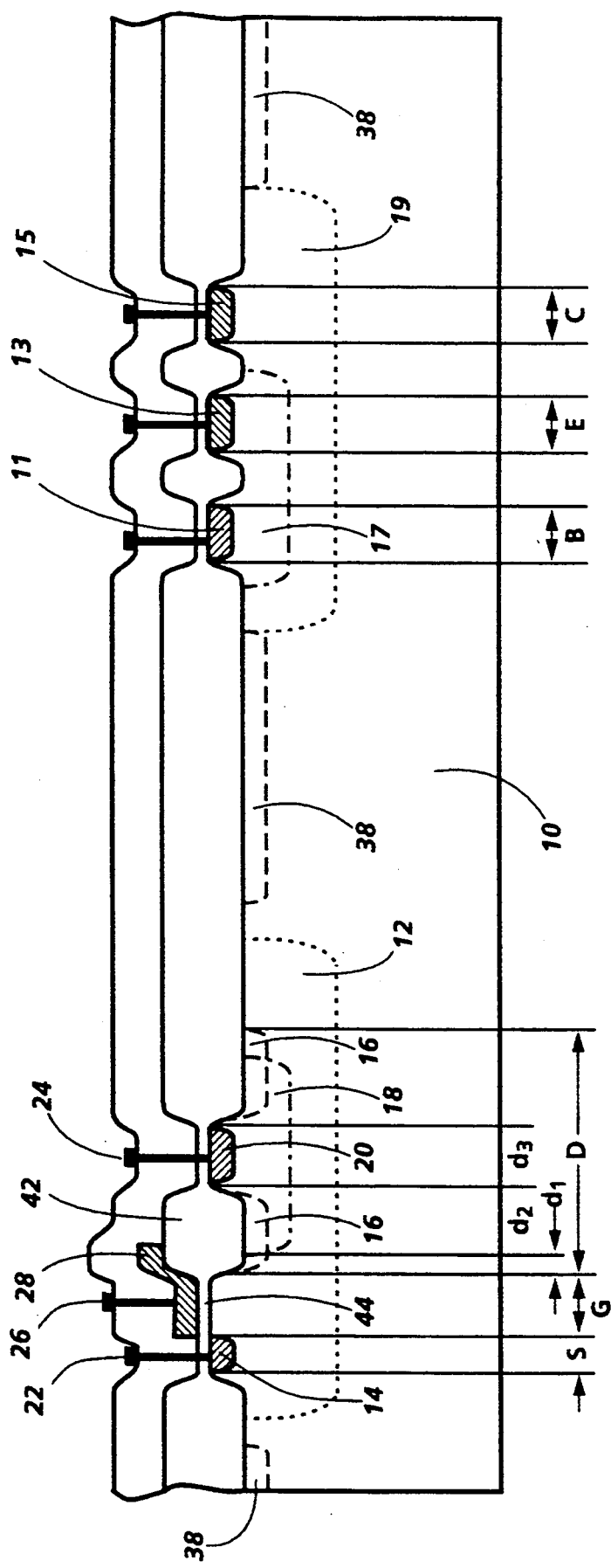
Figure 2J:
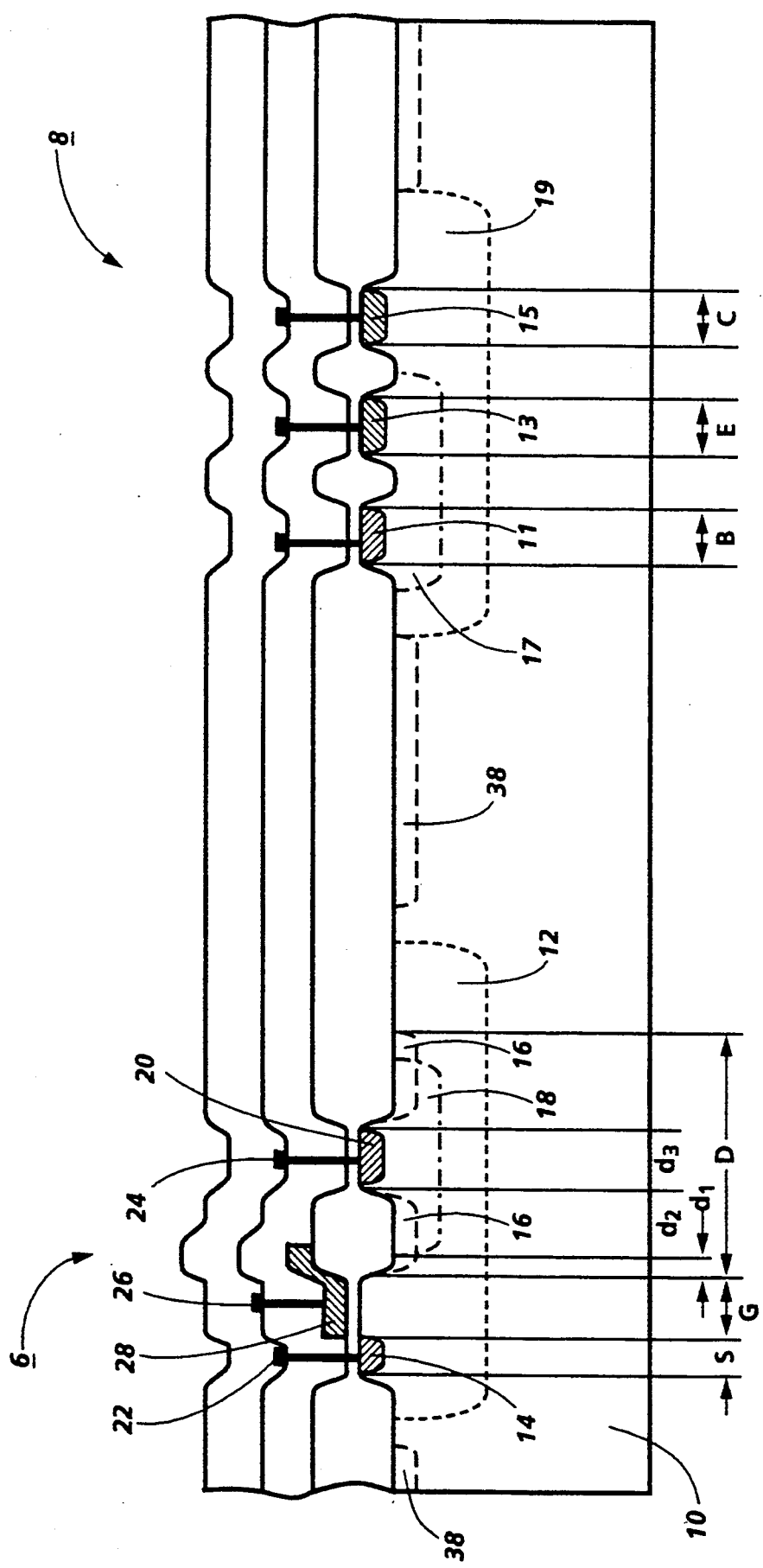

The remaining processes shown in FIGS. 2i through 2j for making contacts, metal lines, electrodes 22, 24, 26 passivation layers etc. are all done in a conventional manner to complete the integrated semiconductor device shown in FIG. 2j.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. The method of forming a field effect transistor having a source, gate and drain on the surface of a p-type substrate comprising the steps of:
   implanting an n-well implant into the surface of the substrate to create two n-wells which overlap each other in an small area,
   forming the gate above the area, and
   implanting an n+ implant into each n-well to form an n+ region in each of the n-wells, the n+ region of one well being the source and the n+ region of the other well being the drain.

2. The method of forming a field effect transistor having a source, gate and drain on the surface of an n-type substrate comprising the steps of:
   implanting a p-well implant into the surface of the substrate to create two p-wells which overlap each other in an area,
   forming the gate above the area, and
   implanting a p+ implant into each p-well to form a p+ region in each of the p-wells, the p+ region of one well being the source and the p+ region of the other well being the drain.

* * * * *